United States Patent
Wu et al.

(10) Patent No.: US 10,224,365 B2
(45) Date of Patent: Mar. 5, 2019

(54) MICRO LIGHT EMITTING DIODE AND DISPLAY PANEL

(71) Applicant: PlayNitride Inc., Tainan (TW)

(72) Inventors: Chih-Ling Wu, Tainan (TW); Yu-Hung Lai, Tainan (TW); Yi-Min Su, Tainan (TW); Yu-Yun Lo, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 7 days.

(21) Appl. No.: 15/587,212

(22) Filed: May 4, 2017

(65) Prior Publication Data
US 2018/0277591 A1 Sep. 27, 2018

(30) Foreign Application Priority Data
Mar. 27, 2017 (TW) .............................. 106110086 A

(51) Int. Cl.
| H01L 27/15 | (2006.01) |
| H01L 33/38 | (2010.01) |
| H01L 33/40 | (2010.01) |
| H01L 33/60 | (2010.01) |

(52) U.S. Cl.
CPC ............ *H01L 27/156* (2013.01); *H01L 33/38* (2013.01); *H01L 33/40* (2013.01); *H01L 33/60* (2013.01)

(58) Field of Classification Search
CPC ....... H01L 27/156; H01L 33/38; H01L 33/40; H01L 33/60
USPC ........................................................ 257/89
See application file for complete search history.

(56) References Cited

U.S. PATENT DOCUMENTS

| 8,704,257 B2* | 4/2014 | Chen ...................... H01L 33/46 257/98 |
| 2012/0049223 A1* | 3/2012 | Yang ...................... H01L 33/38 257/98 |
| 2012/0126259 A1* | 5/2012 | Mizutani ............... H01L 27/156 257/88 |
| 2014/0252382 A1* | 9/2014 | Hashimoto ........... H01L 33/504 257/88 |
| 2015/0372191 A1* | 12/2015 | Watanabe ............... H01L 33/16 257/43 |
| 2016/0084484 A1* | 3/2016 | Sun ......................... H01L 33/36 362/382 |

(Continued)

FOREIGN PATENT DOCUMENTS

| TW | 201427068 | 7/2014 |
| TW | 201708635 | 3/2017 |

OTHER PUBLICATIONS

"Office Action of Taiwan Counterpart Application," dated Jul. 11, 2017, p. 1-p. 8.

*Primary Examiner* — Jami Valentine Miller
(74) *Attorney, Agent, or Firm* — J.C. Patents

(57) ABSTRACT

A micro LED including an epitaxial stack layer, a first electrode and a second electrode is provided. A lower surface of the first electrode is in contact with an upper surface of a first semiconductor layer of the epitaxial stack layer. An upper surface of the second electrode is in contact with a lower surface of a second semiconductor layer of the epitaxial stack layer. The lower surface of the first electrode substantially coincides with the upper surface of the first semiconductor layer. The upper surface of the second electrode substantially coincides with the lower surface of the second semiconductor layer. Furthermore, a display panel is also provided.

21 Claims, 4 Drawing Sheets

(56) References Cited

U.S. PATENT DOCUMENTS

| | | | |
|---|---|---|---|
| 2016/0172253 A1* | 6/2016 | Wu | H01L 33/62 |
| | | | 438/15 |
| 2017/0062683 A1* | 3/2017 | Chen | H01L 33/405 |
| 2017/0133552 A1* | 5/2017 | Lai | H01L 33/025 |
| 2017/0219120 A1* | 8/2017 | Chen | F16K 99/0048 |

* cited by examiner

MICRO LIGHT EMITTING DIODE AND DISPLAY PANEL

CROSS-REFERENCE TO RELATED APPLICATION

This application claims the priority benefit of Taiwan application serial no. 106110086, filed on Mar. 27, 2017. The entirety of the above-mentioned patent application is hereby incorporated by reference herein and made a part of this specification.

BACKGROUND OF THE INVENTION

1. Field of the Invention

The invention relates to a light emitting diode and a display panel, and more particularly, to a micro light emitting diode (Micro LED; µLED) and a display panel using the micro light emitting diode.

2. Description of Related Art

With advancements in optoelectronic technologies, various optoelectronic elements have been gradually developed trending to volume microminiaturization. In recent years, due to the breakthrough in production size for the light emitting diode (LED), a micro LED display panel with microminiaturization of light emitting diodes applied on a display is gradually being given weight to. The micro LED display panel is characterized by high efficiency, longer lifetime, relatively stable material that is insensitive to environmental influences and capability of providing image frames with high resolution. With those advantages, the micro LED display panel becomes the mainstream of future display technology. However, because a micro light emitting diode chip used is rather small in terms of chip size, the difficulty for making the micro LED display panel is relatively higher as compared to the general light emitting diodes. Moreover, thermal energy generated during operations of the micro LED display panel can easily affect overall electrical characteristic of the micro light emitting diode. In view of the above, how to solve the problems regarding manufacturing process and heat dissipation has always been one of the issues to be addressed for person skilled in the art

SUMMARY OF THE INVENTION

The invention provides a micro light emitting diode, which is capable of allowing a display panel using such micro light emitting diode to provide a simpler manufacturing process, a favorable cooling effect and a favorable electrical characteristic.

The invention provides a display panel, which can provide a simpler manufacturing process, a favorable cooling effect, a favorable electrical characteristic and a favorable production yield rate.

In one embodiment of the invention, a micro light emitting diode including an epitaxial stack layer, a first electrode and a second electrode is proposed. A lower surface of the first electrode is in contact with an upper surface of a first semiconductor layer of the epitaxial stack layer. The lower surface of the first electrode substantially coincides with the upper surface of the first semiconductor layer. An upper surface of the second electrode is in contact with a lower surface of a second semiconductor layer of the epitaxial stack layer. The upper surface of the second electrode substantially coincides with the lower surface of the second semiconductor layer.

In one embodiment of the invention, a display panel including a backpanel, a first bonding layer, a plurality of aforesaid micro light emitting diodes and a second bonding layer is proposed. The first bonding layer is disposed on the backpanel, and is electrically connected to the backpanel. The micro light emitting diodes are disposed on the first bonding layer, and the micro light emitting diodes are electrically connected to the first bonding layer. The second bonding layer is electrically connected to the micro light emitting diodes, and the micro light emitting diodes are located between the first bonding layer and the second bonding layer.

In one embodiment of the invention, the display panel further includes an insulation layer. The insulation layer is disposed between any adjacent two of the micro light emitting diodes.

In one embodiment of the invention, an inclined angle is provided between a lateral surface of the second semiconductor layer and the upper surface of the second electrode, and the inclined angle ranges from 45° to 85°.

In one embodiment of the invention, a lateral surface of the first semiconductor layer is coplanar with a lateral surface of the first electrode.

In one embodiment of the invention, the first semiconductor layer is a P-type semiconductor layer, and the second semiconductor layer is an N-type semiconductor layer.

In one embodiment of the invention, a thickness of the first electrode is greater than a thickness of the first semiconductor layer.

In one embodiment of the invention, a ratio of a thickness of the first electrode to a thickness of the first semiconductor layer ranges from greater than 1 to less than or equal to 10.

In one embodiment of the invention, a material of the first electrode includes a transparent or semi-transparent conductive material, and a material of the second electrode includes a metal material.

In one embodiment of the invention, a sectional shape of the epitaxial stack layer is a trapezoid.

In one embodiment of the invention, a thickness of the epitaxial stack layer ranges from 2 µm to 6 µm.

In one embodiment of the invention, a maximum width of the epitaxial stack layer ranges from 1 µm to 50 µm.

In one embodiment of the invention, a ratio of a thickness of the epitaxial stack layer to a maximum width of the epitaxial stack layer ranges from 0.1 to 1.5.

In one embodiment of the invention, the backpanel further includes a plurality of pixels. Each of the pixels includes at least three sub-pixels, and at least one of the micro light emitting diodes is located within the sub-pixel.

In one embodiment of the invention, the display panel further includes a plurality of reflective elements. The micro light emitting diode is located between any adjacent two of the reflective elements.

In one embodiment of the invention, the second bonding layer is connected to upper surfaces and lateral surfaces of the first electrodes of the micro light emitting diodes.

Based on the above, in the micro light emitting diode according to the embodiments of the invention, the lower surface of the first electrode substantially coincides with the upper surface of the first semiconductor layer, and the upper surface of the second electrode substantially coincides with the lower surface of the second semiconductor layer. With said coincident design, the micro light emitting diode according to the embodiments can rapidly transfer heat to the outside so as to provide favorable cooling effect and favorable electrical characteristic. Also, with said coincident design, the micro light emitting diodes can be bonded to the backpanel of the display panel more stably, such that the manufacturing process can be simpler. Because the display panel according to the embodiments has aforementioned micro light emitting diodes, the display panel of the display panel can also provide favorable cooling effect and favorable electrical characteristic as well as favorable manufacturing process.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
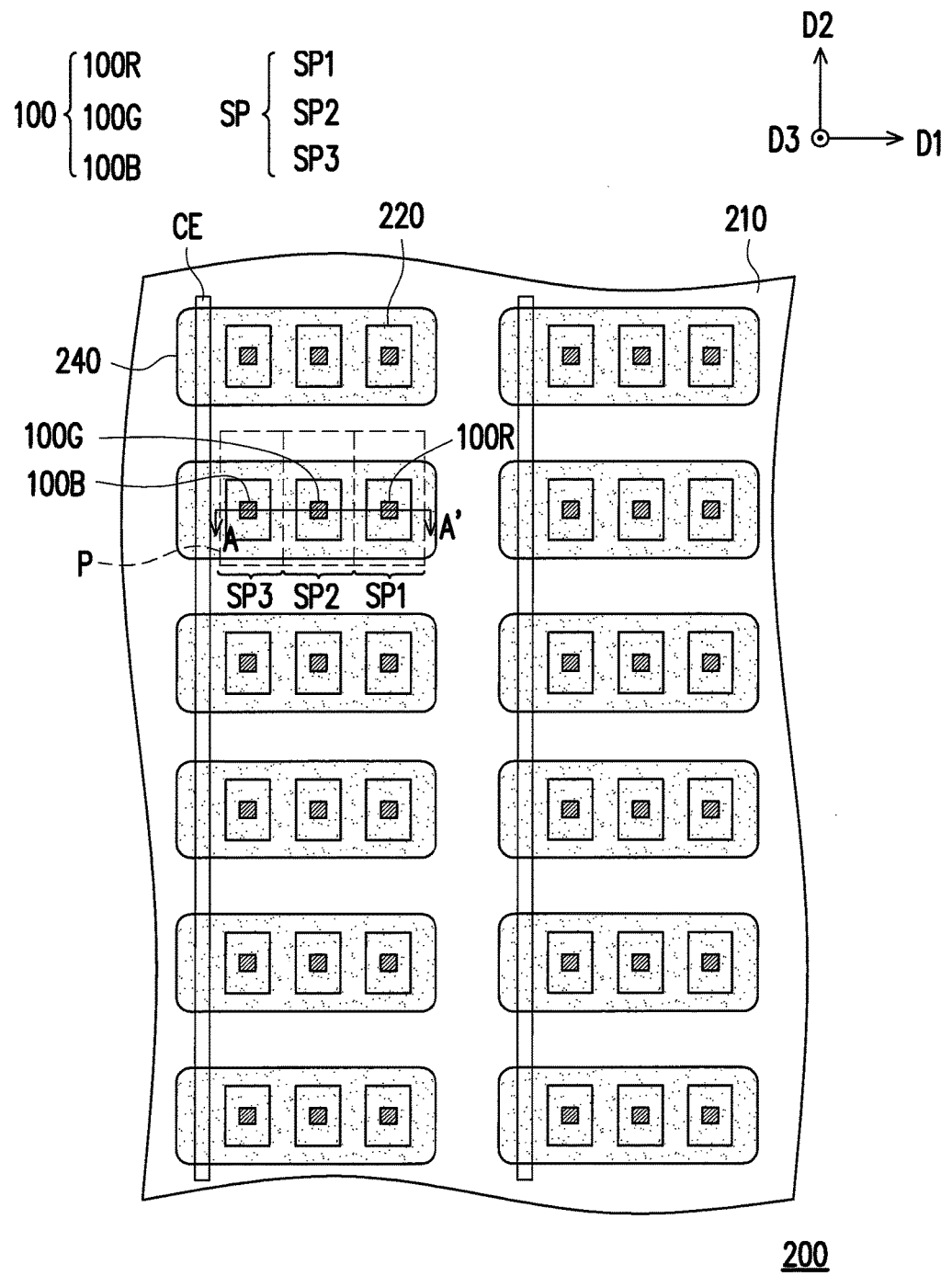
FIG. 1A is a partial top view of a display panel according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
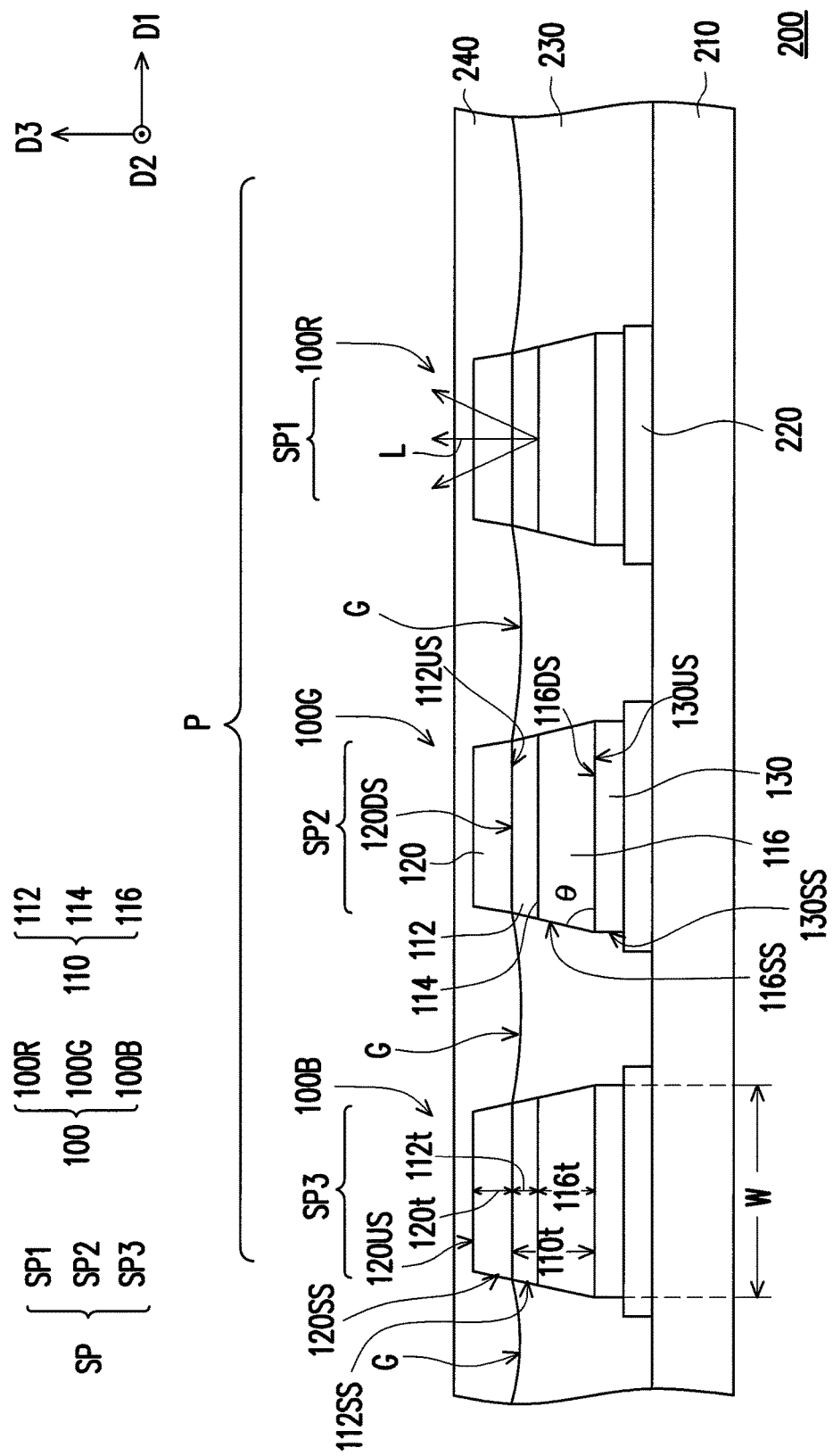
FIG. 1B is a cross-sectional view along a line A-A' depicted in FIG. 1A.

FIG. 1A is a partial top view of a display panel according to an embodiment of the invention. FIG. 1B is a cross-sectional view along a line A-A' depicted in FIG. 1A. With reference to FIGS. 1A and 1B, in the present embodiment, a display panel 200 is implemented by a micro LED display panel. The display panel 200 includes a backpanel 210, a first bonding layer 220, a plurality of micro light emitting diodes 100, an insulation layer 230 and a second bonding layer 240. The backpanel 210 has a plurality of pixels P (only one pixel P is exemplarily illustrated in FIG. 1A), and each of the pixels P further includes a plurality of sub-pixels SP. The pixel P includes, for example, three sub-pixels SP1, SP2 and SP3, but the invention is not limited thereto. The first bonding layer 220 is disposed on the backpanel 210, and is electrically connected to the backpanel 210. The micro light emitting diodes 100 are disposed on the first bonding layer 220, and the micro light emitting diodes 100 are electrically connected to the first bonding layer 220. Further, at least one of the micro light emitting diodes 100 is located in the sub-pixel SP. Specifically, a red micro light emitting diode 100R is, for example, located in the sub-pixel SP1; a blue micro light emitting diode 100B is, for example, located in the sub-pixel SP2; a green micro light emitting diode 100G is, for example, located in the sub-pixel SP3, but the invention is not limited to the above. The micro light emitting diodes 100 are electrically connected to the first bonding layer 220. The second bonding layer 240 is electrically connected to the micro light emitting diodes 100, and the micro light emitting diodes 100 and the insulation layer 230 are located between the first bonding layer 220 and the second bonding layer 240. In other embodiments not illustrated, it is also possible that the display panel does not include the insulation layer 230, which is not particularly limited by the invention. Here, the first bonding layer 220 is a non-continuous patterned structure, and each of the micro light emitting diodes 100 is correspondingly connected to one first bonding layer 220. In the present embodiment, a material of the first bonding layer 220 includes a metal material such as Au, Cu, Sn, In, an alloy of the above material and a combination of the above materials. A material of the second bonding layer 240 includes a transparent or semi-transparent material such as a thin-film metal, Indium Tin Oxide (ITO), a conductive polymer compound, Graphene and a combination of the above materials, but the invention is not limited to the above. The second bonding layer 240 can be regarded as a common electrode. With reference to FIG. 1B, the second bonding layers 240 are connected to upper surfaces 120US and lateral surfaces 120SS of the first electrodes 120 of the micro light emitting diodes 100. In comparison with the micro LED display panel in conventional art where the common electrode is only bonded on upper surfaces of electrodes, the second bonding layer 240 can have a larger contact area with the first electrode 120 in the display panel 200 of the present embodiment to provide more preferable ohmic contact and current conduction. The insulation layer 230 is located on gaps G between the micro light emitting diodes 100, and a material of the insulation layer 230 may be a thermal curing insulation material or a photo curing insulation material. In the present embodiment, the material of the insulation layer 230 is, for example, a photo resist. In particular, it should be noted that the insulation layer 230 herein is disposed between first semiconductor layers 112 of any adjacent two of the micro light emitting diodes 100 and exposes the first electrode 120 to form a smooth curved surface, which can facilitate subsequent manufacturing process of the second bonding layer 240 for improved process yield. Here, the second bonding layers 240 are respectively connected to all the micro light emitting diodes 100 in each of the pixels P. In other embodiments not illustrated, the second bonding layer 240 may also be entirely connected to all the micro light emitting diodes 100 in all the pixels, but the invention is not limited thereto. The display panel 200 further includes a plurality of connection electrodes CE, electrically connected to a driving unit (not illustrated) in the backpanel 210. Each of the connection electrodes CE extends along a direction D2. Each of the second bonding layers 240 extends along a direction D1. Each of the connection electrodes CE is connected to the second bonding layer 240. In the present embodiment, the display panel 200 controls whether the micro light emitting diode 100 in each sub-pixel SP emits light by the driving unit (not illustrated) in the backpanel 210, so as to control an image displayed by the pixels P. Enough teaching, suggestion, and implementation illustration for operations and implementations of the display panel 200 may be obtained with reference to common knowledge in the related art, which is not repeated hereinafter.

In the present embodiment, the backpanel 210 is implemented by a thin film transistor (TFT) substrate. In other embodiments, the backpanel 210 may be a semiconductor substrate, a submount, a CMOS (Complementary Metal-Oxide-Semiconductor) circuit substrate, a LCOS (Liquid Crystal on Silicon) substrate or other substrates having the driving unit, which are not particularly limited by the invention.

With reference to FIG. 1B, in the present embodiment, the micro light emitting diode 100 is implemented by a vertical type LED. Each of the micro light emitting diodes 100 includes an epitaxial stack layer 110, said first electrode 120 and a second electrode 130. The epitaxial stack layer 110 includes said first semiconductor layer 112, a light emitting layer 114 and a second semiconductor layer 116. In the present embodiment, the first semiconductor layer 112 is a P-type semiconductor layer for providing electron holes, and a material thereof includes II-VI group materials (e.g., p-ZnSe) or III-V group materials (e.g., p-AlGaAs, p-GaAsP, p-AlGaInP, p-AlGaP, p-InGaN, p-AlN, p-InN, p-AlGaN, p-AlInGaN, p-GaN or p-GaP), but the invention is not limited thereto. The second semiconductor layer 116 is an N-type semiconductor layer for providing electrons, and a material thereof includes II-VI group materials (e.g., n-ZnSe) or III-V group materials (e.g., n-AlGaAs, n-GaAsP, n-AlGaInP, n-AlGaP, n-InGaN, n-AlN, n-InN, n-AlGaN, n-AlInGaN, n-GaN or n-GaAs), but the invention is not limited thereto. In other embodiments, the first semiconductor layer 112 may also be the N-type semiconductor layer for providing electrons, and the second semiconductor layer 116 may also be the P-type semiconductor layer for providing electron holes. In another embodiment, the first semiconductor layer 112 and the second semiconductor layer 116 may also be semiconductor layers for other usages rather than being limited only to be the semiconductor layers for providing carriers. In other words, the first semiconductor layer 112 may also be a purposely non-doped semiconductor layer, and the second semiconductor layer 116 may also be a purposely non-doped semiconductor layer. The invention is not limited by the usages of the first semiconductor layer 112 and the second semiconductor layer 116. The light emitting layer 114 is located between the first semiconductor layer 112 and the second semiconductor layer 116, and the light emitting layer 114 is, for example, a MQW (Multiple Quantum Well) structure constituted by multiple InGaN layers and multiple GaN layers (InGaN/GaN) alternately stacked over one another. The first electrode 120 and the second electrode 130 are respectively located at two sides of the epitaxial stack layer 110. The first electrode 120 is disposed on the first semiconductor layer 112, and a lower surface 120DS of the first electrode 120 is in contact with an upper surface 112US of the first semiconductor layer 112 of the epitaxial stack layer 110. The second semiconductor layer 116 is disposed on the second electrode 130, and an upper surface 130US of the second electrode 130 is in contact with a lower surface 116DS of the second semiconductor layer 116 of the epitaxial stack layer 110. Each of the first electrode 120 and the second electrode 130 is electrically connected to the epitaxial stack layer 110. The lower surface 120DS of the first electrode 120 substantially coincides with the upper surface 112US of the first semiconductor layer 112. The upper surface 130US of the second electrode 130 substantially coincides with the lower surface 116DS of the second semiconductor layer 116. Specifically, an area and a shape and the lower surface 120DS of the first electrode 120 are substantially identical to an area and a shape of the upper surface 112US of the first semiconductor layer 112 respectively. An area of the upper surface 130US of the second electrode 130 is substantially identical to an area of the lower surface 116DS of the second semiconductor layer 116. Further, a ratio of the area of the lower surface 120DS of the first electrode 120 to the area of the upper surface 112US of the first semiconductor layer 112 ranges from 0.95 to 1.05. A ratio of the area of the upper surface 130US of the second electrode 130 to the area of the lower surface 116DS of the second semiconductor layer 116 ranges from 0.95 to 1.05. In other words, within the above area ratio ranges, the areas of aforementioned surfaces can be regarded as identical to one another.

As described above, in the micro light emitting diode 100 of the present embodiment, the two surfaces 120DS and 112US where the first electrode 120 is in contact with the first semiconductor layer 112 substantially coincide with each other, and the two surfaces 130US and 116US where the second electrode 130 is in contact with the second semiconductor layer 116 substantially coincide with each other. Accordingly, the micro light emitting diode 100 of the present embodiment can rapidly transfer heat to the outside so as to provide favorable cooling effect and favorable electrical characteristic. Also, with said coincident design, the micro light emitting diodes 100 can be bonded to the backpanel 210 of the display panel 200 more stably, such that the manufacturing process can be simpler. Because the display panel 200 of the present embodiment has aforementioned micro light emitting diodes 100, the display panel 200 of the present embodiment can also provide favorable cooling effect and favorable electrical characteristic as well as favorable manufacturing process.

In the present embodiment, the lateral surface 112SS of the first semiconductor layer 112 is coplanar with the lateral surface 120SS of the first electrode 120, namely, there is no inclined angle between the lateral surface 112SS of the first semiconductor layer 112 and the lateral surface 120SS of the first electrode 120. An inclined angle θ is provided between a lateral surface 116SS of the second semiconductor layer 116 and the upper surface 130US of the second electrode 130. The lateral surface 130SS of the second electrode 130 is approximately perpendicular to the upper surface 130US of the second electrode 130. More preferably, the inclined angle θ is an acute angle and the inclined angle ranges from 45° to 85°. Specifically, a sectional shape of the epitaxial stack layer 110 is a trapezoid. Specifically, the sectional shape of the epitaxial stack layer 110 is a positive trapezoid. The acute angle of the trapezoid is located adjacent to the backpanel 210 to facilitate the subsequent manufacturing process on the micro light emitting diode 100 (e.g., a bonding process for the micro light emitting diode 100 and the second bonding layer 240), and thus a more preferable production yield rate can be achieved.

In the present embodiment, a thickness 110t of the epitaxial stack layer 110 ranges from 2 μm to 6 μm, but the invention is not limited thereto. A maximum width W of the epitaxial stack layer 110 ranges from 1 μm to 50 μm, but the invention is not limited thereto. If a ratio of the thickness 110t of the epitaxial stack layer 110 to the maximum width W of the epitaxial stack layer 110 ranges from 0.1 to 1.5, the micro light emitting diode 100 is less likely to break when the structure of the micro light emitting diode 100 undergoes a high-temperature and high-pressure manufacturing process (e.g., when the micro light emitting diode 100 is to be bonded to the first bonding layer 220), such that more preferable production yield rate can be achieved.

On the other hand, a thickness 120t of the first electrode 120 ranges, for example, from 1000 Å (angstrom) to 10000 Å. In comparison with the conventional micro light emitting diode, because the micro light emitting diode 100 is provided with the design of thicker electrodes, a more preferable photoelectric characteristic can be achieved. Also, a more preferable manufacturing allowance can be provided in the subsequent manufacturing process of the common electrode (i.e. the second bonding layer 240) on the first electrode 120. The thickness 120t of the first electrode 120 is greater than a thickness 112t of the first semiconductor layer 112. More preferably, a ratio of the thickness 120t of the first electrode 120 to the thickness 112t of the first semiconductor layer 112 ranges from greater than 1 to less than or equal to 10. Because the thickness 120t of the first electrode 120 is thicker than the thickness 112t of the first semiconductor layer 112 in the micro light emitting diode 100 of the present embodiment to facilitate the subsequent manufacturing process of the second bonding layer 240, more preferable production yield rate and current conduction efficiency can be achieved. In addition, in the present embodiment, a material of the first electrode 120 includes a transparent or semi-transparent material such as Indium Tin Oxide (ITO), a conductive polymer compound and graphene, but the invention is not limited to the above. A material of the second electrode 130 includes a metal material such as Pt, Ni, Ti, Au, Cr, an alloy of the above and a combination of the above, but the invention is not limited thereto. Because the first electrode 120 includes the transparent or semi-transparent material which has high transmittance, a light beam L emitted by the micro light emitting diode 100 is less likely absorbed by the first electrode 120 but can penetrate the first electrode 120 to the outside. Specifically, a light transmittance of the material of the first electrode 120 ranges, for example, from greater than or equal to 80% to less than or equal to 100%, but the invention is not limited thereto.

Here, it should be noted that the following embodiments continue to use certain content in the previous embodiment and description for the same technical contents is omitted. Description regarding same element name can refer to the certain content in the foregoing embodiment, which is not repeated in the following embodiments.

Figure 2:
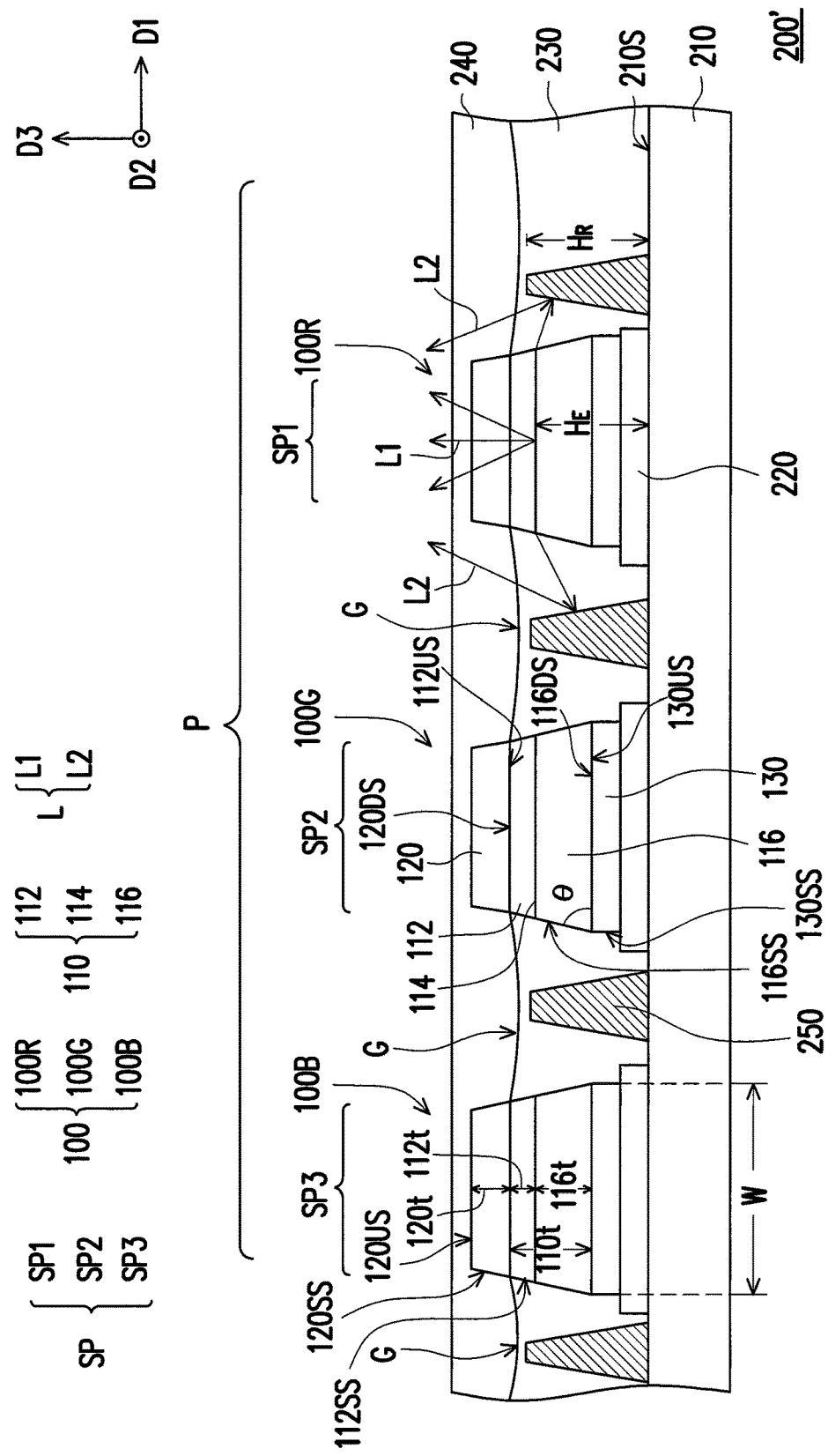
FIG. 2 is a partial cross-sectional view of a display panel according to another embodiment of the invention.

FIG. 2 is a partial cross-sectional view of a display panel according to another embodiment of the invention. With reference to FIG. 2, a display panel 200' of the present embodiment is substantially identical to the display panel 200 in FIG. 1A and FIG. 1B, a major difference between the two is described as follows. In the present embodiment, the display panel 200' further includes a plurality of reflective elements 250. A material of the reflective element 250 includes a metal material or other materials with reflecting capability, which are not particularly limited by the invention. One micro light emitting diode 100 is located between any adjacent two of the reflective elements 250. These micro light emitting diodes 100 and these reflective elements 250 are, for example, commonly disposed on a surface 210S of the backpanel 210. A height $H_R$ of the reflective element 250 is a height between a surface of the reflective element 250 farthest away from the backpanel 210 and the surface 210S of the backpanel 210. A height $H_E$ of the light emitting layer 114 is a height between the light-emitting layer 114 and the surface 210S of the backpanel 210. The height $H_R$ of the reflective element 250 is higher than the height $H_E$ of the light emitting layer 114 of the epitaxial stack layer 110. Therefore, when the micro light emitting diode 100 is driven to emit light, light beams L1, as the majority of the light beam L emitted by the micro light emitting diode 100, are transferred along a forward direction D3. As another part of the light beam L, light beams L2 are transferred along two directions at left and right sides of the micro light emitting diode 100. Next, the light beams L2 are substantially emerged along the forward direction D3 after being reflected by the reflective element 250. In this way, the display panel 200' of the present embodiment can further improve a frame brightness of the display panel 200' with the configuration of the reflective elements 250. It should be noted that, the reflective elements 250 may also be manufactured by integrating with the backpanel 210.

Figure 3:
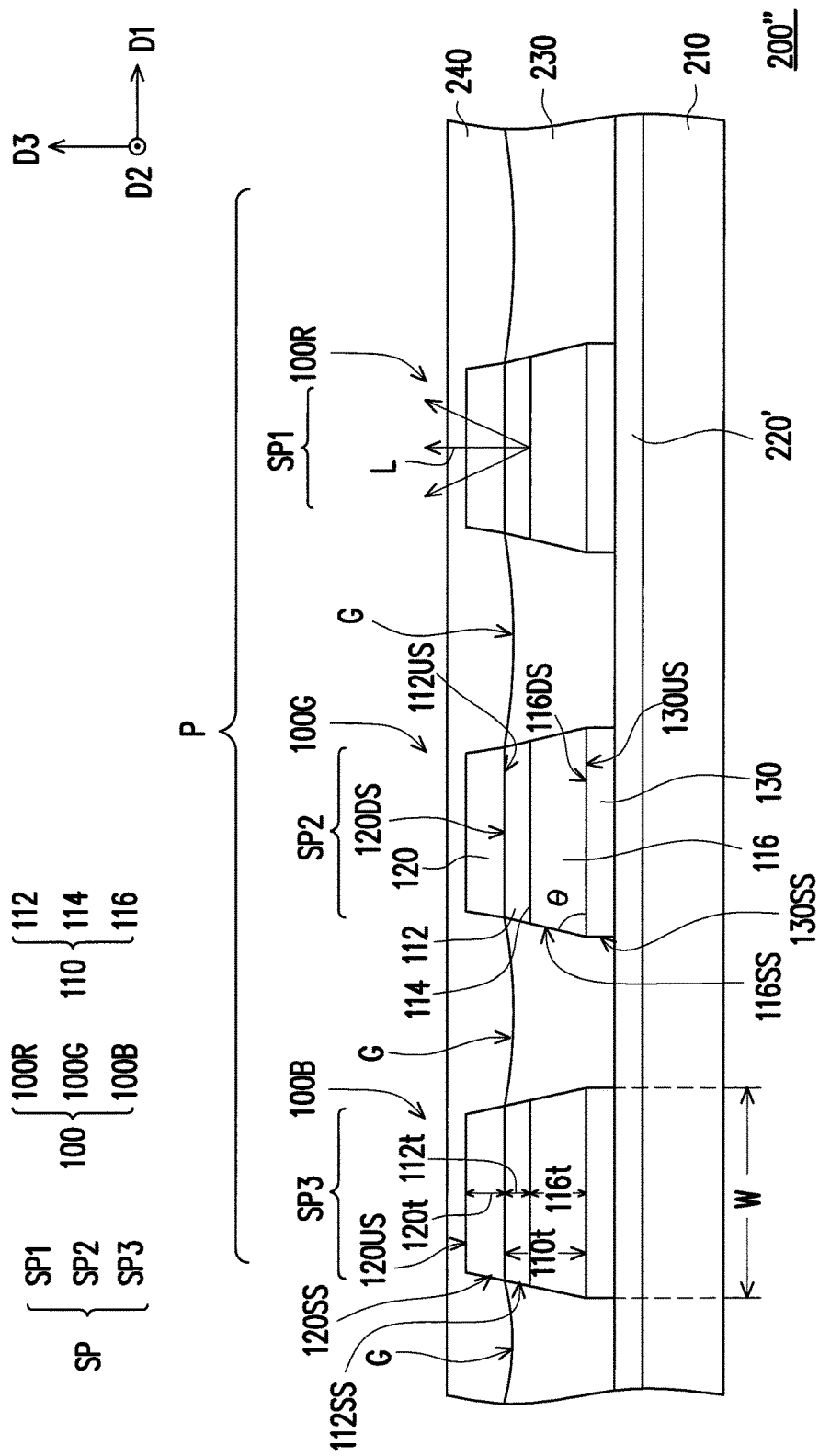
FIG. 3 is a partial cross-sectional view of a display panel according to yet another embodiment of the invention.

FIG. 3 is a partial cross-sectional view of a display panel according to yet another embodiment of the invention. With reference to FIG. 3, a display panel 200" of the present embodiment is substantially identical to the display panel 200 in FIG. 1A and FIG. 1B, a major difference between the two is described as follows. The first bonding layer 220 of FIG. 1B is a non-continuous structure. A first bonding layer 220' is a continuous structure, and the micro light emitting diodes 100 are electrically connected to the first bonding layer 220'. In other embodiments not illustrated, the first bonding layer 220' is, for example, a continuous structure having a plurality of concave portions and a plurality of convex portions. The micro light emitting diodes 100 are, for example, respectively disposed at the concave portions of the first bonding layer 220'. The convex portion can be higher than the height of the light emitting layer 114 of the micro light emitting diode 100 so the convex portion can reflect the light beam L emitted by the micro light emitting diode 100 to increase the light emission in the forward direction, but the invention is not limited thereto.

In summary, in the micro light emitting diode according to the embodiments of the invention, the lower surface of the first electrode substantially coincides with the upper surface of the first semiconductor layer, and the upper surface of the second electrode substantially coincides with the lower surface of the second semiconductor layer. With said coincident design, the micro light emitting diode according to the embodiments can rapidly transfer heat to the outside so as to provide favorable cooling effect and favorable electrical characteristic. Also, with said coincident design, the micro light emitting diodes can be bonded to the backpanel of the display panel more stably, such that the manufacturing process can be simpler. Because the display panel according to the embodiments has aforementioned micro light emitting diodes, the display panel of the display panel can also provide favorable cooling effect and favorable electrical characteristic as well as favorable manufacturing process. Furthermore, in the micro light emitting diode, the thickness of the first electrode is greater than the thickness of the first semiconductor layer. Moreover, the sectional shape of the epitaxial stack layer is designed as the trapezoid to facilitate the subsequent manufacturing process of the second bonding layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A micro light emitting diode, comprising:
an epitaxial stack layer, wherein a maximum width of the epitaxial stack layer ranges from 1 μm to 50 μm;
a first electrode having a lower surface, the lower surface being in contact with an upper surface of a first semiconductor layer of the epitaxial stack layer, and the lower surface of the first electrode substantially coinciding with the upper surface of the first semiconductor layer; and
a second electrode having an upper surface, the upper surface being in contact with a lower surface of a second semiconductor layer of the epitaxial stack layer, and the upper surface of the second electrode substantially coinciding with the lower surface of the semiconductor layer.

2. The micro light emitting diode according to claim 1, wherein an inclined angle is provided between a lateral surface of the second semiconductor layer and the upper surface of the second electrode, and the inclined angle ranges from 45° to 85°.

3. The micro light emitting diode according to claim 1, wherein a lateral surface of the first semiconductor layer is coplanar with a lateral surface of the first electrode.

4. The micro light emitting diode according to claim 1, wherein the first semiconductor layer is a P-type semiconductor layer, and the second semiconductor layer is an N-type semiconductor layer.

5. The micro light emitting diode according to claim 1, wherein a thickness of the first electrode is greater than a thickness of the first semiconductor layer.

6. The micro light emitting diode according to claim 5, wherein a ratio of a thickness of the first electrode to a thickness of the first semiconductor layer ranges from greater than 1 to less than or equal to 10.

7. The micro light emitting diode according to claim 1, wherein a material of the first electrode comprises a transparent or semi-transparent conductive material, and a material of the second electrode comprises a metal material.

8. The micro light emitting diode according to claim 1, wherein a sectional shape of the epitaxial stack layer is a trapezoid.

9. The micro light emitting diode according to claim 1, wherein a thickness of the epitaxial stack layer ranges from 2 nm to 6 nm.

10. The micro light emitting diode according to claim 1, wherein a ratio of a thickness of the epitaxial stack layer to a maximum width of the epitaxial stack layer ranges from 0.1 to 1.5.

11. A display panel, comprising:
a backpanel;
a first bonding layer, disposed on the backpanel and electrically connected to the backpanel;
a plurality of micro light emitting diodes, disposed on the first bonding layer, the micro light emitting diodes being electrically connected to the first bonding layer, wherein each of the micro light emitting diodes comprises:
an epitaxial stack layer, wherein a maximum width of the epitaxial stack layer ranges from 1 µm to 50 µm;
a first electrode having a lower surface, the lower surface being in contact with an upper surface of a first semiconductor layer of the epitaxial stack layer, and the lower surface of the first electrode substantially coinciding with an upper surface of a first semiconductor layer of the epitaxial stack layer; and
a second electrode having an upper surface, the upper surface being in contact with a lower surface of a second semiconductor layer of the epitaxial stack layer, and the upper surface of the second electrode substantially coinciding with the lower surface of the second semiconductor layer of the epitaxial stack layer; and
a second bonding layer, electrically connected to the micro light emitting diodes, the micro light emitting diodes being located between the first bonding layer and the second bonding layer.

12. The display panel according to claim 11, further comprising an insulation layer, wherein the insulation layer is disposed between any adjacent two of the micro light emitting diodes.

13. The display panel according to claim 11, wherein an inclined angle is provided between a lateral surface of the second semiconductor layer and the upper surface of the second electrode, and the inclined angle ranges from 45° to 85°.

14. The display panel according to claim 11, wherein a lateral surface of the first semiconductor layer is coplanar with a lateral surface of the first electrode.

15. The display panel according to claim 11, wherein the first semiconductor layer is a P-type semiconductor layer, and the second semiconductor layer is an N-type semiconductor layer.

16. The display panel according to claim 11, wherein a thickness of the first electrode is greater than a thickness of the first semiconductor layer.

17. The display panel according to claim 16, wherein a ratio of a thickness of the first electrode to a thickness of the first semiconductor layer ranges from greater than 1 to less than or equal to 10.

18. The display panel according to claim 11, wherein the second bonding layer is connected to upper surfaces and the lateral surfaces of the first electrodes of the micro light emitting diodes.

19. The display panel according to claim 11, wherein a sectional shape of the epitaxial stack layer is a trapezoid.

20. The display panel according to claim 11, wherein the backpanel further comprises a plurality of pixels, wherein each of the pixels comprises at least three sub-pixels, wherein at least one of the micro light emitting diodes is located with the sub-pixel.

21. The display panel according to claim 11, further comprising a plurality of reflective elements, wherein each of the micro light emitting diodes is located between any adjacent two of the reflective elements.

* * * * *